(12) United States Patent
Inagaki

(10) Patent No.: US 8,421,238 B2
(45) Date of Patent: Apr. 16, 2013

(54) STACKED SEMICONDUCTOR DEVICE WITH THROUGH VIA

(75) Inventor: Daisuke Inagaki, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/218,034

(22) Filed: Aug. 25, 2011

(65) Prior Publication Data
US 2011/0309520 A1 Dec. 22, 2011

Related U.S. Application Data

(63) Continuation of application No. PCT/JP2010/000580, filed on Feb. 1, 2010.

(30) Foreign Application Priority Data

Mar. 27, 2009 (JP) .................................. 2009-079743

(51) Int. Cl.
*H01L 23/48* (2006.01)
*H01L 21/4763* (2006.01)

(52) U.S. Cl.
USPC ............ 257/774; 257/E23.011; 257/E23.145; 257/E21.577; 257/E21.578; 438/629; 438/667

(58) Field of Classification Search .................. None
See application file for complete search history.

(56) References Cited

U.S. PATENT DOCUMENTS

| 6,621,169 B2 * | 9/2003 | Kikuma et al. ............... 257/780 |
| 6,809,421 B1 | 10/2004 | Hayasaka et al. |
| 7,023,011 B2 * | 4/2006 | Atanackovic et al. .......... 257/22 |
| 7,956,443 B2 * | 6/2011 | Akram et al. .................. 257/621 |
| 2004/0232554 A1 | 11/2004 | Hirano et al. |
| 2005/0009329 A1 | 1/2005 | Tanida et al. |
| 2005/0167812 A1 | 8/2005 | Yoshida et al. |
| 2008/0217790 A1 * | 9/2008 | Hasunuma ..................... 257/774 |
| 2009/0115047 A1 * | 5/2009 | Haba et al. ..................... 257/690 |

FOREIGN PATENT DOCUMENTS

| JP | 10-012720 | 1/1998 |
| JP | 2001-044197 | 2/2001 |
| JP | 2004-342690 | 12/2004 |
| JP | 2004-349537 | 12/2004 |
| JP | 4011695 | 9/2007 |
| JP | 4145301 | 6/2008 |
| WO | WO 2008/035261 A1 | 3/2008 |

OTHER PUBLICATIONS

T. Mitsuhashi, "3-D Package Technology using Through-Si-Via," w/ English translation thereof.

* cited by examiner

*Primary Examiner* — Alonzo Chambliss
(74) *Attorney, Agent, or Firm* — McDermott Will & Emery LLP

(57) ABSTRACT

A semiconductor device includes a semiconductor substrate including a first surface and a second surface opposite to the first surface, and a through-via penetrating the semiconductor substrate. The through-via has a stacked structure of a first conductive film formed in a portion of the semiconductor substrate closer to the first surface, and a second conductive film formed in a portion of the semiconductor substrate closer to the second surface. An insulating layer is buried inside the semiconductor substrate. The first conductive film is electrically connected to the second conductive film in the insulating layer.

21 Claims, 9 Drawing Sheets

STACKED SEMICONDUCTOR DEVICE WITH THROUGH VIA

CROSS-REFERENCE TO RELATED APPLICATION

This is a continuation of PCT International Application PCT/JP2010/000580 filed on Feb. 1, 2010, which claims priority to Japanese Patent Application No. 2009-079743 filed on Mar. 27, 2009. The disclosures of these applications including the specifications, the drawings, and the claims are hereby incorporated by reference in their entirety.

BACKGROUND

The present disclosure relates to semiconductor devices and manufacturing methods of the devices, and more particularly to semiconductor devices with a structure suited for stacked packaging by using through-vias and manufacturing methods of the devices.

Known are semiconductor devices formed by three-dimensionally stacking a plurality of semiconductor devices for higher integration and miniaturization of semiconductor products.

Also, in recent years, semiconductor devices including through-vias have been developed as a technique of three-dimensionally stacking a plurality semiconductor devices.

Japanese Patent No. 4011695 shows an example (first conventional example) of a manufacturing method of a semiconductor device including a through-via.

According to the method, first, a hole (non-through hole at this time) is formed in a silicon substrate (before forming an interconnect and after forming an element) covered by an insulating film, from an element formation surface (front surface) toward the opposite surface (back surface). Then, after forming an insulating film (via coating film) to cover a sidewall surface of a non-through hole, a metal film is buried in the hole which becomes a through-via. Next, the metal film is removed by chemical mechanical polishing (CMP) or etch-back until the insulating film on the substrate surface is exposed. This forms a via structure inside the hole. After that, a multilayer interconnect structure is formed on a silicon substrate to be electrically connected to the via structure inside the hole. Then, the silicon substrate is polished from the back surface, thereby exposing the via structure inside the hole to the back surface of the substrate to form a through-via.

Japanese Patent No. 4145301 shows another example (second conventional example) of a manufacturing method of a semiconductor device including a through-via.

According to this method, first, a silicon substrate including an element and a multilayer interconnect layer at an element formation surface (front surface) is thinned from the back surface. Then, a through hole is formed from the back surface of the silicon substrate to reach an electrode pad inside the multilayer interconnect layer at the front surface. Next, after forming an insulating film (via coating film) to cover the sidewall surface of the through hole, a metal film is buried in the through hole by electroplating to form a through-via.

SUMMARY

However, in the formation method of the through-via according to the above-described first conventional example, when the size of the through-via decreases in accordance with miniaturization, the hole (non-through hole at the time of formation) formed in the silicon substrate has a high aspect ratio. This makes it difficult to form the insulating film (via coating film) and the metal film with sufficient large thickness within the hole. As a result, a burying failure of the metal film causes an increase in resistance of the through-via (i.e., connection resistance between the semiconductor devices electrically connected by the through-via), and deformation of the via coating film causes a leakage current between the through-via and the silicon substrate to reduce reliability.

Similarly, in the formation method of the through-via according to the above-described second conventional example, when the size of the through-via decreases in accordance with miniaturization, the hole formed in the silicon substrate has a higher aspect ratio. This makes it difficult to form the insulating film (via coating film) and the metal film with sufficient large thickness in the through-hole, thereby causing problems similar to those in the formation method of the through-via according to the first conventional example.

In view of this, it is an objective of the present disclosure to reduce failures in burying a conductive film which becomes a through-via in a hole and deformation of an insulating via coating film to reduce connection resistance between/among stacked semiconductor devices and to improve leakage reliability, even when the size of the through-via decreases in accordance with miniaturization.

In order to achieve the objective, a semiconductor device according to the present disclosure includes a semiconductor substrate including a first surface and a second surface opposite to the first surface, and a through-via penetrating the semiconductor substrate. The through-via has a stacked structure of a first conductive film formed in a portion of the semiconductor substrate closer to the first surface, and a second conductive film formed in a portion of the semiconductor substrate closer to the second surface. An insulating layer is buried inside the semiconductor substrate. The first conductive film is electrically connected to the second conductive film in the insulating layer.

In the semiconductor device according to the present disclosure, the first conductive film may be buried in a first hole formed at the first surface of the semiconductor substrate. The second conductive film may be buried in a second hole formed at the second surface of the semiconductor substrate. The first hole may be connected to the second hole, and the first conductive film may be electrically connected to the second conductive film, thereby forming the through-via.

An opening size of the second hole at a connecting portion with the first hole is preferably greater than an opening size of the first hole at a connecting portion with the second hole. The first hole is preferably located deeper than the second hole. An opening size of the second hole at the second surface is preferably greater than an opening size of the first hole at the first surface.

In the semiconductor device according to the present disclosure, the insulating layer may be discontinuously formed along a principal surface of the semiconductor substrate. Specifically, the insulating layer may be selectively formed in the formation region of the through-via in the semiconductor substrate by, e.g., separation by implanted oxygen (SIMOX).

In the semiconductor device according to the present disclosure, a first insulating via coating film may be formed between the first conductive film and the semiconductor substrate. A second insulating via coating film may be formed between the second conductive film and the semiconductor substrate.

A first stacked semiconductor device according to the present disclosure is formed by stacking a first semiconductor device including a logic circuit and a second semiconductor device including a solid-state image sensor. At least one of the first semiconductor device or the second semiconductor device is the above-described semiconductor device of the present disclosure.

In the first stacked semiconductor device according to the present disclosure, the second semiconductor device may be stacked on the first semiconductor device.

A second stacked semiconductor device according to the present disclosure is formed by stacking a first semiconductor device, a second semiconductor device, and a third semiconductor device. The second semiconductor device is stacked on a first region of the first semiconductor device. The third semiconductor device is stacked on a second region of the first semiconductor device. At least one of the first semiconductor device, the second semiconductor device, or the third semiconductor device is the above-described semiconductor device of the present disclosure.

In the second stacked semiconductor device according to the present disclosure, the first semiconductor device, the second semiconductor device, and the third semiconductor device may have different functions.

In the second stacked semiconductor device according to the present disclosure, a top of the second semiconductor device may be located at a substantially same height as a top of the third semiconductor device.

In the second stacked semiconductor device according to the present disclosure, the first semiconductor device may include a logic circuit. The second semiconductor device may include a memory element. The third semiconductor device may include a solid-state image sensor.

A manufacturing method of a semiconductor device according to the present disclosure includes the steps of: (a) forming a first hole in a semiconductor substrate from a first surface of the semiconductor substrate including the first surface and a second surface opposite to the first surface; (b) forming a first conductive film in the first hole; (c) forming a second hole connected to the first hole in the semiconductor substrate from the second surface of the semiconductor substrate; and (d) forming in the second hole, a second conductive film to be electrically connected to the first conductive film, thereby forming a through-via. An insulating layer is buried inside the semiconductor substrate. The first conductive film is electrically connected to the second conductive film in the insulating layer.

In the manufacturing method of the semiconductor device of the present disclosure, the insulating layer may be formed by SIMOX. The insulating layer may be discontinuously formed along a principal surface of the semiconductor substrate.

In the manufacturing method of the semiconductor device of the present disclosure, in the step (c), the semiconductor substrate may be etched from the second surface using the insulating layer as an etching stopper to form the second hole.

In the manufacturing method of the semiconductor device of the present disclosure, an opening size of the second hole at a connecting portion with the first hole may be greater than an opening size of the first hole at a connecting portion with the second hole.

In the manufacturing method of the semiconductor device of the present disclosure, an opening size of the second hole at the second surface may be greater than an opening size of the first hole at the first surface.

As described above, according to the present disclosure, a stacked structure of the first conductive film buried from the first surface of the semiconductor substrate, and the second conductive film buried from the second surface of the semiconductor substrate is used to form the through-via. Thus, even when the size of the through-via decreases with miniaturization, an increase in aspect ratios of the holes, in which the conductive films are buried, can be mitigated as compared to the aspect ratio of the entire through hole in which the through-via is buried. This enables formation of the insulating films (via coating films) as well as the conductive films with sufficient large thickness in the holes. This reduces failures of burying the conductive films which become the through-via in the holes to reduce contact resistance between/among the stacked semiconductor devices, and reduces deformation of the insulating via coating films to improve leakage reliability.

Therefore, the present disclosure provides a semiconductor device and a manufacturing method of the device suited for stacked packaging using a through-via.

DETAILED DESCRIPTION

First Embodiment

A semiconductor device according to a first embodiment of the present disclosure will be described hereinafter with reference to the drawings. Note that what is shown in the figures as well as forms, materials, sizes, etc. of various elements are merely examples and not limited to what is described in this embodiment. What is described in this embodiment may be modified as appropriate without departing from the spirit and scope of the present disclosure.

Figure 1:
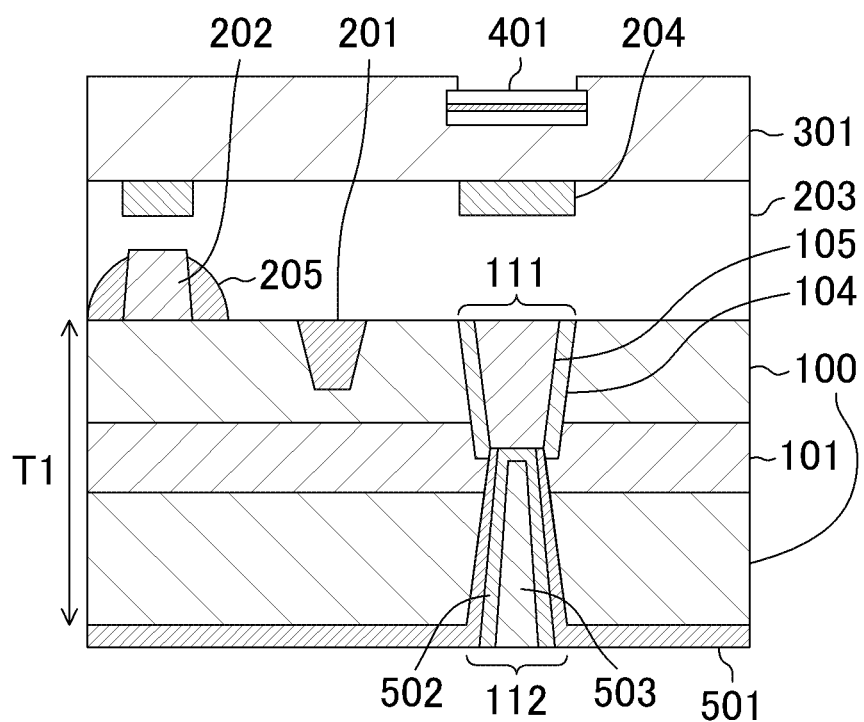
FIG. 1 is a cross-sectional view of a semiconductor device according to a first embodiment of the present disclosure.

FIG. 1 is a cross-sectional view of the semiconductor according to the first embodiment.

As shown in FIG. 1, an impurity region (not shown) of an active element such as a transistor and a diode is formed at a first surface of a semiconductor substrate 100 in which an insulating layer 101 is buried. A gate electrode 202 is formed on the first surface of the semiconductor substrate 100 with a gate insulating film (not shown) interposed therebetween. The semiconductor substrate 100 including the insulating layer 101 has a thickness of T1. A memory element etc. may be formed at the first surface of the semiconductor substrate 100 together with the active elements. The active element is electrically isolated from other elements by an isolation 201 formed at the first surface of the semiconductor substrate 100. An insulating sidewall spacer 205 is formed on each side surface of the gate electrode 202. An interlayer insulating film 203 is formed on the first surface of the semiconductor substrate 100 to cover the gate electrode 202. A plug (not shown) and an interconnect 204 are formed in the interlayer insulating film 203. A multilayer interconnect structure 301 formed by stacking interlayer insulating films, in each of which an interconnect and a via (both not shown) are provided, is formed on the interlayer insulating film 203. An electrode pad 401 for extracting a signal outside the device is formed in an upper portion of the multilayer interconnect structure 301.

As shown in FIG. 1, a first hole 111 reaching the insulating layer 101 is formed in a portion of the semiconductor substrate 100 closer to the first surface. A first conductive film 105 is buried in the first hole 111. A second hole 112 connected to the first hole 111 in the insulating layer 101 is formed in a portion of the semiconductor substrate 100 closer to a second surface. A second conductive film 503 is buried in the second hole 112 with a base metal layer 502 interposed therebetween. Note that an insulating film (first insulating via coating film) 104 is interposed between the first conductive film 105 and the semiconductor substrate 100. An insulating film (second insulating via coating film) 501 is interposed between the base metal layer 502 and the semiconductor substrate 100. The insulating film 501 is formed to continuously cover from the sidewall surface of the second hole 112 to the second surface of the semiconductor substrate 100.

In this embodiment, the first conductive film 105 in the first hole 111 is electrically connected to the second conductive film 503 in the second hole 112 via the base metal layer 502, thereby forming the through-via penetrating the semiconductor substrate 100 from the first surface to the second surface. Specifically, the through-via of this embodiment has a stacked structure of the first conductive film 105 formed in the portion of the semiconductor substrate 100 closer to the first surface, and the second conductive film 503 formed in a portion of the semiconductor substrate 100 closer to the second surface. Although not shown in the figure, the through-via of this embodiment is electrically connected to the electrode pad 401 via a plug, a via, and an interconnect, which are formed in the interlayer insulating film 203 and the multilayer interconnect structure 301, at the first surface of the semiconductor substrate 100. When multiple ones of the semiconductor device of this embodiment with such a structure are stacked one on another, the through-via of one of the semiconductor devices is electrically connected to the electrode pad 401 of another semiconductor device located lower at the second surface of the semiconductor substrate 100, thereby providing a three-dimensionally stacked semiconductor device.

One of the features of the above-described semiconductor device according to the first embodiment is that the through-via has the stacked structure of the first conductive film 105 formed in the portion of the semiconductor substrate 100 closer to the first surface, and the second conductive film 503 formed in the portion of the semiconductor substrate 100 closer to the second surface. Thus, even when the size of the through-via decreases with miniaturization, an increase in aspect ratios of the holes 111 and 112, in which the conductive films 105 and 503 are respectively buried, can be mitigated as compared to the aspect ratio of the entire through hole in which the through-via is buried. This enables formation of the insulating films (via coating films) 104 and 501 as well as the conductive films 105 and 503 with sufficient large thickness in the holes 111 and 112. This reduces failures of burying the conductive films 105 and 503, which become a through-via, in the holes 111 and 112 to reduce contact resistance between/among the stacked semiconductor devices, and reduces deformation of the insulating films (via coating films) 104 and 501 to improve leakage reliability.

Note that, in this embodiment, the contact portion of the first conductive film 105 and the second conductive film 503 (specifically, electrically connected portion via the base metal layer 502), i.e., the connecting portion of the first hole 111 and the second hole 112 is preferably located in the insulating layer 101. This structure reliably provides insulation of the contact portion of the first conductive film 105 and the second conductive film 503 from the semiconductor substrate 100. This further improves leakage reliability, and reduces connection failures between/among the stacked semiconductor devices.

In the semiconductor device of this embodiment shown in FIG. 1, while the insulating layer 101 is continuously formed in the semiconductor substrate 100 along the substrate principal surface, the insulating layer 101 may be discontinuously formed along the substrate principal surface. Specifically, the insulating layer 101 may be selectively formed only in the formation region of the through-via in the semiconductor substrate 100 by, e.g., SIMOX.

In the semiconductor device of this embodiment shown in FIG. 1, the first conductive film 105 constituting the through-via is formed only in the semiconductor substrate 100 including the insulating layer 101. However, the first conductive film 105 may be formed to, e.g., the inside of the interlayer insulating film 203 so that the first conductive film 105 is electrically connected to, e.g., the interconnect 204 etc. formed in the interlayer insulating film 203 on the semiconductor substrate 100. Note that, if the first hole 111 in which the first conductive film 105 is buried has a low aspect ratio, the insulating film 104 functioning as a via coating film can be reliably formed on a sidewall of the first hole 111. Therefore, the first conductive film 105 is preferably formed only in the semiconductor substrate 100 including the insulating layer 101.

In this embodiment, each of the insulating film 104 between the first conductive film 105 and the semiconductor substrate 100, and the insulating film 501 between the second conductive film 503 and the semiconductor substrate 100 may be a $SiO_2$ film, a SiN film, etc.

In this embodiment, the first conductive film 105 may be made of doped Poly-Si, a refractory material such as molybdenum or tungsten, a silicide of the materials, or the like.

In this embodiment, the base metal layer 502 may be made of, for example, TiN, TaN, a Ti/TiN stacked structure, Ta/TaN stacked structure, etc.

In this embodiment, the second conductive film 503 may be made of copper, or alternately, aluminum, doped copper, or doped aluminum, etc.

A manufacturing method of the semiconductor device according to the first embodiment will be described hereinafter with reference to the drawings.

FIGS. 2A-2H and FIGS. 3A-3E are cross-sectional views of steps of the manufacturing method of the semiconductor device according to this embodiment.

Figure 2A:
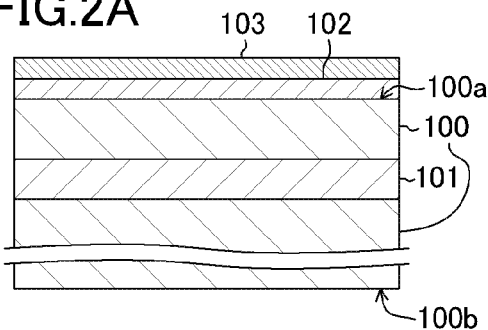
FIGS. 2A-2H are cross-sectional views of steps of a manufacturing method of the semiconductor device according to the first embodiment.

First, as shown in FIG. 2A, the semiconductor substrate 100 is prepared, in which the insulating layer 101 made of, e.g., silicon dioxide is buried. Such a semiconductor substrate 100 can be obtained by forming an insulating layer buried in a silicon substrate by, e.g., SIMOX. The insulating layer 101 made of silicon nitride may be formed instead of the insulating layer 101 of silicon dioxide by implanting nitrogen into the semiconductor substrate 100. Alternately, a silicon on insulator (SOI) substrate obtained by bonding may be used. In this case, the substrate may be a semiconductor region at the second surface, or an insulating region made of a material different from that of the insulating layer 101. Note that, while a transistor and a memory element, etc. are formed at the first surface (device formation surface 100a) of the semiconductor substrate 100, any element or interconnect constituting an electric circuit is not formed at the second surface (back surface 100b) of the semiconductor substrate 100. At the time shown in FIG. 2A, the semiconductor substrate 100 including the insulating layer 101 has a thickness of, e.g., about 700 μm. Furthermore, an insulating film 102 being, e.g., a $SiO_2$ film and an insulating film 103 being, e.g., a SiN film are stacked on the first surface of the semiconductor substrate 100. A single-layer insulating film may be formed instead of the multilayer film of the insulating films 102 and 103.

Figure 2B:
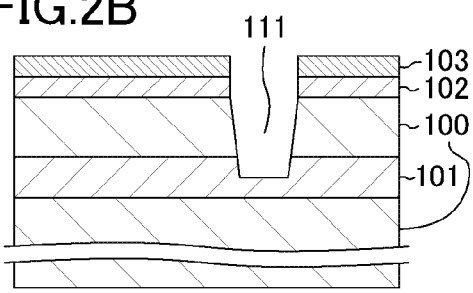

Next, as shown in FIG. 2B, a resist mask (not shown) having an opening in a through-via formation region is formed on the insulating film 103. After that, the insulating films 103 and 102 are sequentially etched by reactive ion etching (RIE), and then the resist mask is removed. Then, RIE is performed using the insulating films 103 and 102 having the openings in the through-via formation region as a mask, and fluorine containing gas as etching gas, thereby etching the semiconductor substrate 100. Then, a non-through hole (first hole) 111 is formed, which has a predetermined depth at a predetermined position of the semiconductor substrate 100. At this time, the insulating layer (buried insulating film) 101 functions as an etching stop layer. As a result, the bottom of the first hole 111 is located in the insulating layer 101. This enables reduction in depth variations of the first hole 111. Note that the processing technique of forming the first hole 111 is not limited to the RIE, but may be wet etching, isotropic etching combined with sidewall protection, etc.

Figure 2C:
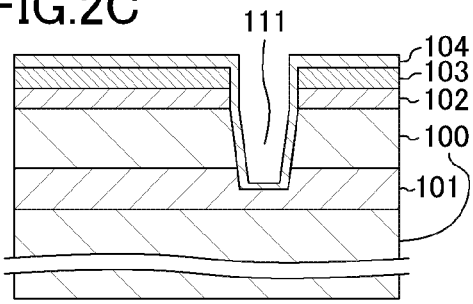

Then, as shown in FIG. 2C, the insulating film 104 being $SiO_2$ film, a SiN film, etc. is formed on the insulating film 103 by, e.g., chemical vapor deposition (CVD) to cover the sidewall surface and the bottom surface of the first hole 111.

Figure 2D:
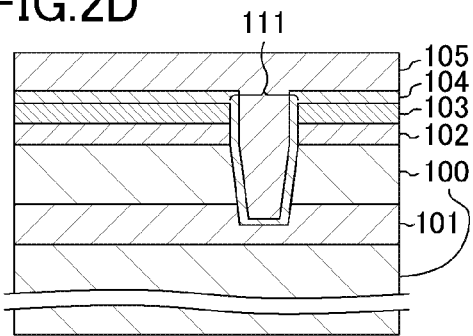

Next, as shown in FIG. 2D, the conductive material (first conductive film) 105 is formed on the insulating film 104 so that the first hole 111 is buried. The first conductive film 105 is made of, e.g., doped Poly-Si, a refractory material such as molybdenum (Mo), tungsten (W), etc., or a silicide of the materials. Note that the first conductive film 105 is preferably made of a material having a higher melting point than the process temperature of the steps performed after formation of the first hole 111.

Figure 2E:
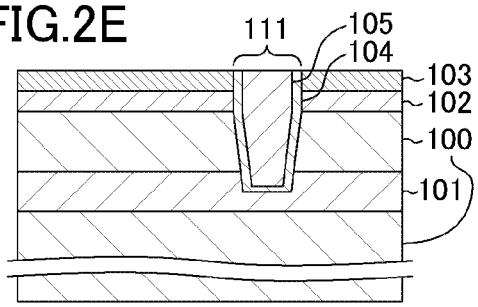
Figure 2F:
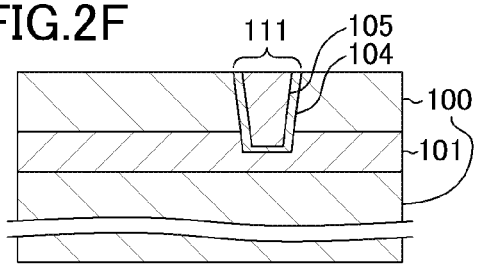

After that, as shown in FIG. 2E, the first conductive film 105 and the insulating film 104 are removed by e.g., CMP, an etch-back process, etc. to back away until the insulating film 103 (or the insulating film 102) is exposed. Then, as shown in FIG. 2F, the insulating films 103 and 102 are removed by, e.g., wet etching or chemical dry etching (CDE). This forms the structure, in which the first conductive film 105 is buried in the first hole 111 formed in the portion of the semiconductor substrate 100 closer to the first surface. Note that, while the insulating films 103 and 102 in the step shown in FIG. 2F, the insulating films 103 and 102 may be retained as a mask for device formation processing to be performed later.

Figure 2G:
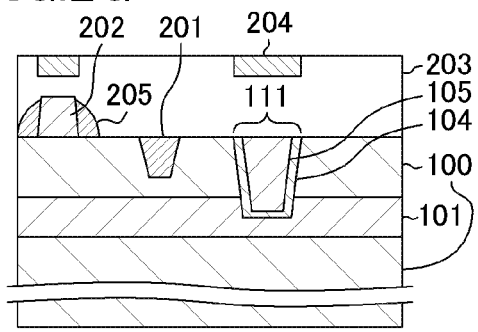

Then, as shown in FIG. 2G, after forming the isolation 201 in a front surface portion at the first surface of the semiconductor substrate 100, the gate electrode 202 is formed on the first surface of the semiconductor substrate 100 with a gate insulating film (not shown) interposed therebetween. After that, an impurity region (not shown) is formed in the front surface portion at the first surface of the semiconductor substrate 100, and the insulating sidewall spacer 205 is formed on a side surface of the gate electrode 202. Then, after forming the interlayer insulating film 203 on the first surface of the semiconductor substrate 100 to cover the gate electrode 202, the interconnect 204 electrically connected to the first conductive film 105 buried in the first hole 111 is formed in the interlayer insulating film 203.

Figure 2H:
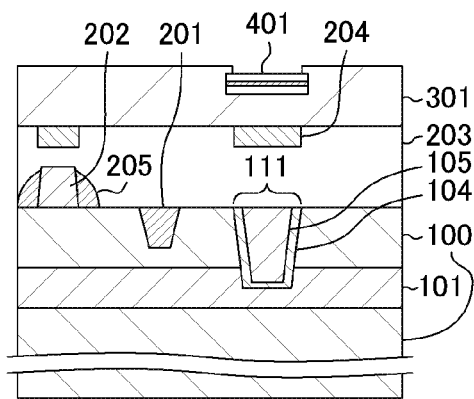

Next, as shown in FIG. 2H, the multilayer interconnect structure 301 formed by stacking an interlayer insulating film including an interconnect and a via (both not shown) inside is formed on the interlayer insulating film 203. After that, a recess is formed in the front surface portion of the interlayer insulating film which is the uppermost layer of the multilayer interconnect structure 301. The electrode pad 401 for extracting a signal outside the device is formed in the recess.

Figure 3A:
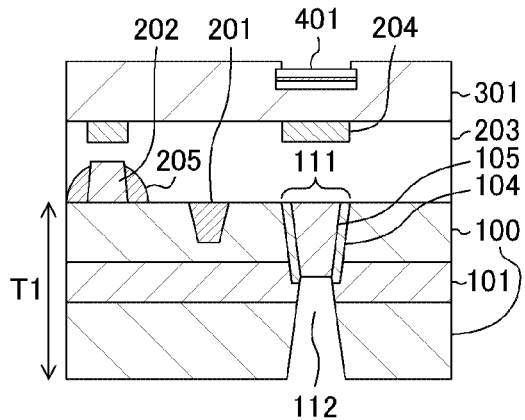
FIG. 3A-3E are cross-sectional views of steps of the manufacturing method of the semiconductor device according to the first embodiment.

Then, as shown in FIG. 3A, removal by, e.g., polishing is performed from the second surface (back surface) of the semiconductor substrate 100 to process the semiconductor substrate 100 including the insulating layer 101 to have a desired thickness of T1, which ranges e.g., from about 10 μm to about 680 μm, more preferably, from about 30 μm to about 150 μm. While mechanical polishing is used for removing the back surface of the semiconductor substrate 100, CMP, wet etching, or dry etching may be used in combination with mechanical polishing. Next, after forming a resist mask (not shown), which has an opening in a through-via formation region, on the second surface of the semiconductor substrate 100 by photolithography, the semiconductor substrate 100 is selectively etched using the resist mask to form the second hole 112 to be connected to the first hole 111 (specifically, so that the first conductive film 105 in the first hole 111 is exposed). When newly forming the second hole 112, the insulating layer 101 buried in the semiconductor substrate 100 is used as an etching stop layer, thereby reducing depth variations of the second hole 112.

Figure 3D:
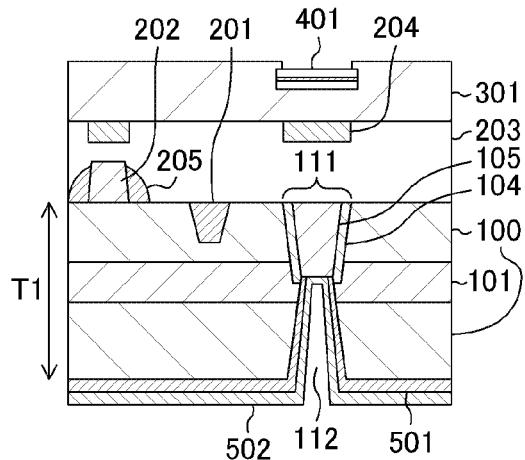
Figure 3B:
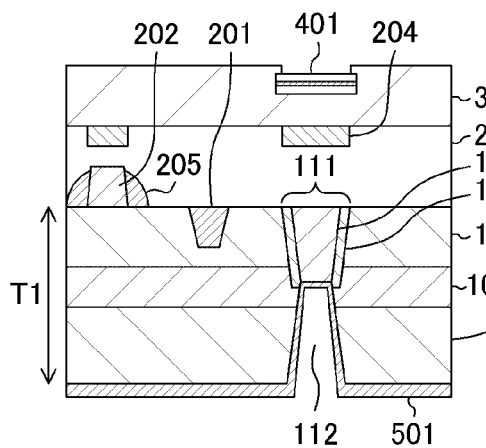

After that, as shown in FIG. 3B, the insulating film 501 being, e.g., a $SiO_2$ film, a SiN film, etc. is formed on the second surface of the semiconductor substrate 100 by, e.g., CVD to cover the sidewall surface and the bottom surface (i.e., the exposed surface of the first conductive film 105) of the second hole 112. Instead of the insulating film having the single-layer structure, an insulating film having a stacked structure may be used as the insulating film 501.

In this embodiment, the insulating film 501 is formed to prevent a through-via from being electrically connected to the semiconductor substrate 100, when the through-via is formed by burying a conductive material in the second hole 112. On the other hand, temperature for forming the insulating film 501 needs to be lower than a melting point of a metal interconnect used for, e.g., the multilayer interconnect structure 301. The concern is thus degraded coverage of the insulating film 501. However, in this embodiment, the through hole provided with the through-via is formed by separately forming the two non-through holes (the holes 111 and 112), thereby reducing degraded coverage of the insulating film 501.

Figure 3E:
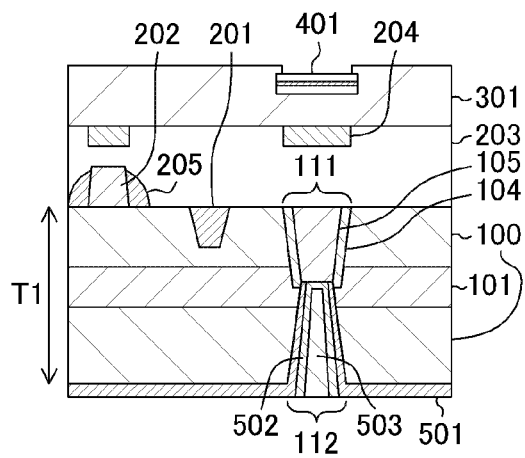
Figure 3C:
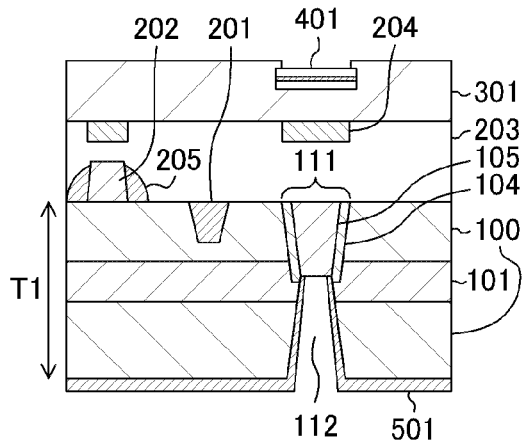

Then, as shown in FIG. 3C, a resist mask (not shown) for protecting the insulating film 501 on the second surface of the semiconductor substrate 100 is formed by photolithography, and a part of the insulating film 501, which covers the bottom surface of the second hole 112 is selectively etched and removed by, e.g., RIE to expose the first conductive film 105 in the second hole 112.

Next, as shown in FIG. 3D, the base metal layer 502, which functions as a barrier layer and a seed layer for electroplating, is formed to cover the second surface of the semiconductor substrate 100 as well as the sidewall surface and the bottom surface of the second hole 112. The base metal layer 502 is formed to be in contact with an exposed portion of the first conductive film 105 in the second hole 112.

After that, as shown in FIG. 3E, the second conductive film 503 is formed on the base metal layer 502 by electroplating to bury the second hole 112. As the material of the second conductive film 503 formed by electroplating, for example, copper is suitable in view of facilitation of plating and electric resistance. Then, the second conductive film 503 and the base metal layer 502 are partially removed by, e.g., CMP to back away until the insulating film 501 on the second surface of the semiconductor substrate 100 is exposed. This provides a through-via which is formed by electrically connecting the first conductive film 105 in the first hole 111 to the second conductive film 503 in the second hole 112. The first conductive film 105 is electrically connected to the second conductive film 503 via the base metal layer 502 in the insulating layer 101 buried in the semiconductor substrate 100.

Next, although not shown in the figure, the semiconductor substrate 100 is separated into electrical circuits by dicing, thereby forming semiconductor devices.

One of the features of the manufacturing method of the semiconductor device according to the first embodiment described above is that the first conductive film 105 in the first hole 111 formed in the portion of the semiconductor substrate 100 closer to the first surface is electrically connected to the second conductive film 503 formed in the second hole 112 in the portion of the semiconductor substrate 100 closer to the second surface to form the through-via. Thus, even when the size of the through-via decreases with miniaturization, an increase in aspect ratios of the holes 111 and 112, in which the conductive films 105 and 503 are buried, can be mitigated as compared to the aspect ratio of the entire through hole in which the through-via may be buried. This enables formation of the insulating films (via coating films) 104 and 501 as well as the conductive films 105 and 503 with sufficient large thickness in the holes 111 and 112. This reduces failures of burying the conductive films 105 and 503, which become the through-via, in the holes 111 and 112 to reduce contact resistance between/among the stacked semiconductor devices, and reduces deformation of the insulating films (via coating films) 104 and 501 to improve leakage reliability.

According to this embodiment, the through-via is formed in the portion of the semiconductor substrate 100 closer to the first surface after forming an active element such as a transistor, memory elements, etc., and thus, a via material having a lower melting point than a process temperature needed for formation of the elements. This enables reduction in resistance of the through-via as compared to the case using a refractory metal material.

According to this embodiment, the through-via is formed in the semiconductor substrate 100 only. This reduces the material to be etched for hole formation as compared to the case where a through-via penetrating not only the semiconductor substrate but also the interconnect layer formed on the semiconductor substrate to be connected to an electrode. Thus, a hole with a smooth sidewall surface can be formed, thereby facilitating formation of the through-via.

Figure 4:
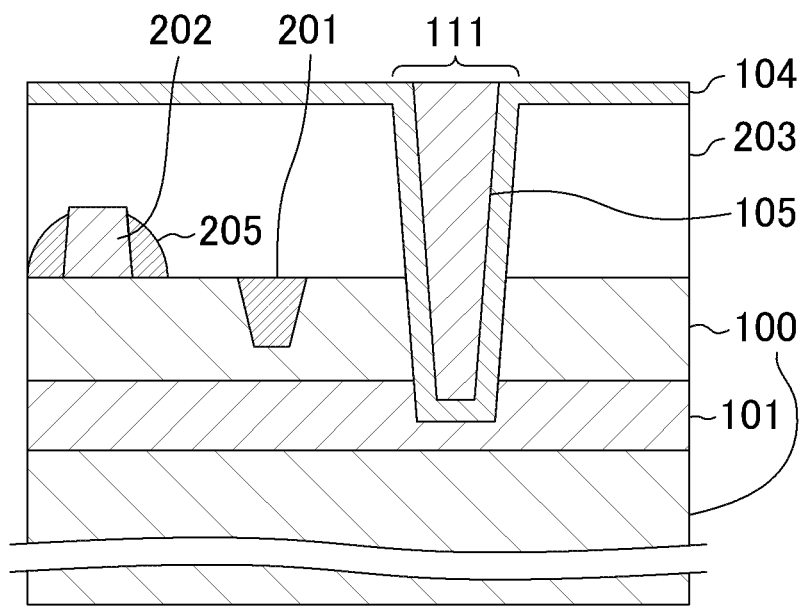
FIG. 4 is a cross-sectional view of a semiconductor device according to a variation of the first embodiment in the middle of the manufacture.

Note that, in this embodiment, the first hole 111 is formed before forming the isolation 201 and the gate electrode 202. Instead, as shown in, e.g., FIG. 4, the first hole 111 penetrating the interlayer insulating film 203 to reach the inside of the semiconductor substrate 100 may be formed after the isolation 201 and the gate electrode 202 are formed and after the interlayer insulating film 203 covers the first surface (device formation surface) of the semiconductor substrate 100. Then, the insulating film 104 and the first conductive film 105 may be sequentially formed in the first hole 111 by the above-described manufacturing method.

While in this embodiment, the insulating layer 101 is continuously formed in the semiconductor substrate 100 along the substrate principal surface. Instead, the insulating layer 101 may be discontinuously formed along the substrate principal surface. Specifically, the insulating layer 101 is selectively formed only in the through-via formation region of the semiconductor substrate 100.

Second Embodiment

A semiconductor device according to a second embodiment of the present disclosure will be described hereinafter with reference to the drawings. Note that what is shown in the figures as well as forms, materials, sizes, etc. of various elements are merely examples and not limited to what is described in this embodiment. What is described in this embodiment may be modified as appropriate without departing from the spirit and scope of the present disclosure.

Figure 5:
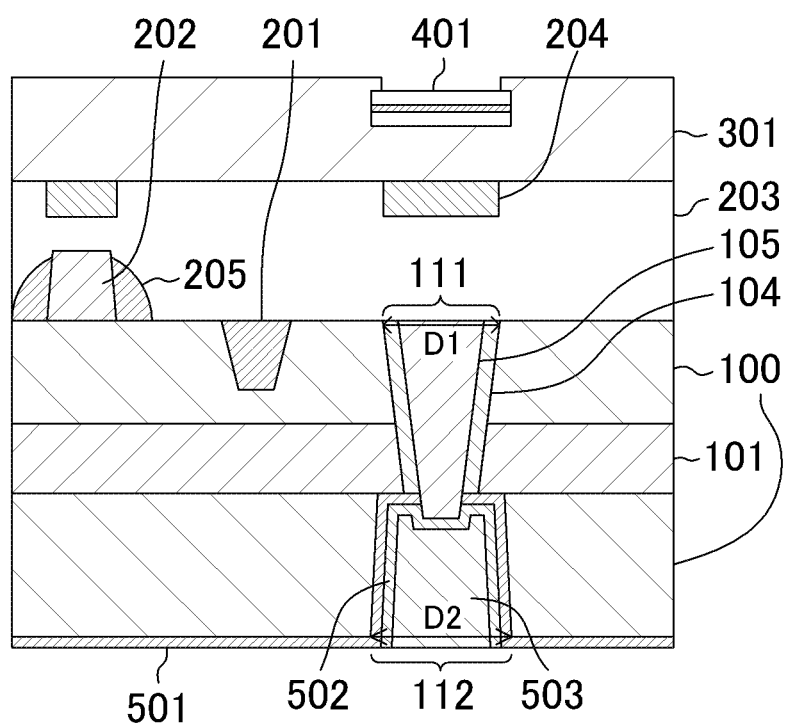
FIG. 5 is a cross-sectional view of a semiconductor device according to a second embodiment of the present disclosure.

FIG. 5 is a cross-sectional view of the semiconductor according to the second embodiment. In FIG. 5, the same reference characters as those of the semiconductor device according to the first embodiment shown in FIG. 1 are used to represent equivalent elements, and repetitive explanation will be omitted.

As a first point, the semiconductor device according to this embodiment differs from the semiconductor device according to the first embodiment shown in FIG. 1 in that the opening size of the second hole 112 at the connecting portion with the first hole 111 is greater than the opening size of the first hole 111 at the connecting portion with the second hole 112, as shown in FIG. 5. This prevents reduction in the area in which the first conductive film 105 is in contact with the second conductive film 503 with the base metal layer 502 interposed therebetween, even when the second hole 112 is misaligned with the first hole 111 during the formation.

As a second point, the semiconductor device according to this embodiment differs from the semiconductor device according to the first embodiment shown in FIG. 1 in that the lower portion of the first conductive film 105 has a greater depth than the insulating layer 101 buried inside the semiconductor substrate 100, as shown in FIG. 5. Accordingly, the first conductive film 105 is electrically connected to the second conductive film 503 in a portion of the semiconductor substrate 100 between the insulating layer 101 and the second surface (back surface). Thus, the first conductive film 105 is electrically connected to the second conductive film 503 also on a side surface of the lower portion of the first conductive film 105. That is, as compared to the case where the lower portion of the first conductive film 105 is located in the insulating layer 101, the area in which the first conductive film 105 is in contact with the second conductive film 503 with the base metal layer 502 interposed therebetween can be increased to reduce resistance of the through-via.

The above-described semiconductor device of this embodiment provides the following advantage in addition to advantages similar to those in the first embodiment. Specifically, as compared to the first embodiment, a structure tolerant of misalignment of the second hole 112 with the first hole 111 is obtained, and electrical connection between the first conductive film 105 and the second conductive film 503 can be reinforced.

Note that, in this embodiment, the first hole 111 has a greater depth than the second hole 112.

In this embodiment, the first conductive film 105 is electrically connected to the second conductive film 503 in the portion of the semiconductor substrate 100 between the insulating layer 101 and the second surface (back surface). Instead, the first conductive film 105 may be electrically connected to the second conductive film 503 at the interface between the insulating layer 101 and the portion of the semiconductor substrate 100 between the insulating layer 101 and the second surface (back surface). This case also provides the advantage of mitigating reduction in the area in which the first conductive film 105 is in contact with the second conductive film 503 with the base metal layer 502 interposed therebetween.

A manufacturing method of the semiconductor device according to the second embodiment of the present disclosure will be described hereinafter with reference to the drawings.

FIGS. 6A-6E are cross-sectional views of steps of the manufacturing method of the semiconductor device according to the second embodiment. In FIGS. 6A-6E, the same reference characters as those shown in FIGS. 2A-2H and FIGS. 3A-3E are used to represent equivalent elements, and repetitive explanation will be omitted.

Figure 6A:
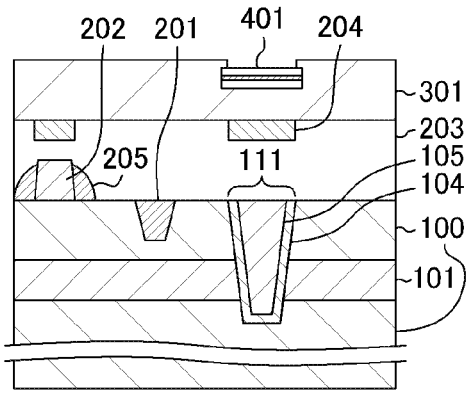
FIGS. 6A-6E are cross-sectional views of steps of a manufacturing method of the semiconductor device according to the second embodiment.

In this embodiment, first, the steps of the first embodiment shown in FIGS. 2A-2H are performed. FIG. 6A illustrates the cross-sectional structure at the time when the steps have been performed, i.e., the first conductive film 105 has been buried in the first hole 111 formed in the part of the semiconductor substrate 100 closer to the first surface, and the interlayer insulating film 203 and the multilayer interconnect structure 301 have been formed to cover the first surface of the semiconductor substrate 100. That is, as shown in FIG. 6A, in this embodiment, the first hole (non-through hole) 111 is formed to penetrate the insulating layer 101, different from the first embodiment shown in FIG. 2H.

Figure 6D:
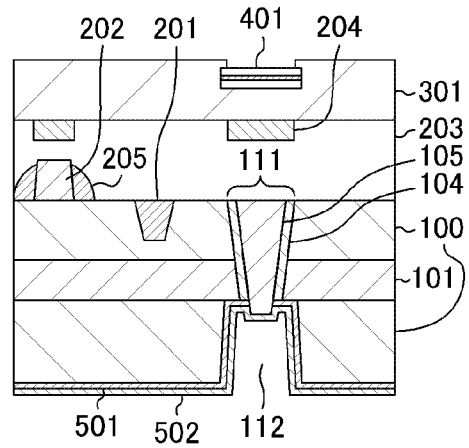
Figure 6B:
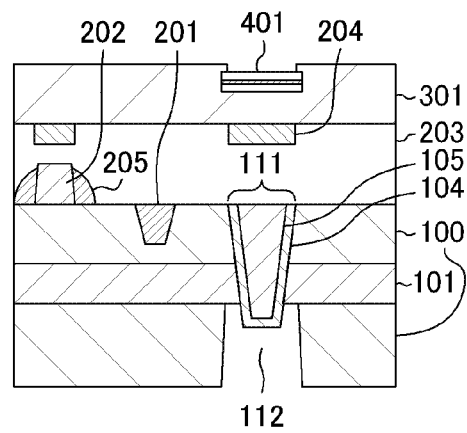

Then, as shown in FIG. 6B, removal by, e.g., polishing is performed from the second surface (back surface) of the semiconductor substrate 100 to process the semiconductor substrate 100 including the insulating layer 101 to have a desired thickness of T1. While mechanical polishing is used for removing the back surface of the semiconductor substrate 100, CMP, wet etching, or dry etching may be used in combination with mechanical polishing. Next, after forming a resist mask (not shown), which has an opening in a through-via formation region, on the second surface of the semiconductor substrate 100 by photolithography, the semiconductor substrate 100 is selectively etched using the resist mask to form the second hole 112 to be connected to the first hole 111 (specifically, so that the insulating film 104 in the first hole 111 is exposed). When newly forming the second hole 112, the insulating layer 101 buried in the semiconductor substrate 100 is used as an etching stop layer, thereby reducing depth variations of the second hole 112. When the etching of the semiconductor substrate 100 is stopped at the insulating layer 101, the second hole 112 can be formed with the insulating film 104 in the first hole 111 exposed.

In this embodiment, the opening size of the second hole 112 formed from the second surface of the semiconductor substrate 100 at the connecting portion with the first hole 111 is determined sufficiently greater than the opening size of the first hole 111 formed in advance from the first surface of the semiconductor substrate 100 at the connecting portion with the second hole 112. Specifically, taking into consideration, the amount of misalignment of the second hole 112 with the first hole 111, the opening size of the second hole 112 at the connecting portion with the first hole 111 is determined. For example, when the amount of the misalignment is a maximum of about 2 μm at each side of the first hole 111, the opening size of the second hole 112 at the connecting portion with the first hole 111 is set about 3 μm greater than the opening size of the first hole 111 at the connecting portion with the second hole 112 at each side of the first hole 111.

Figure 6E:
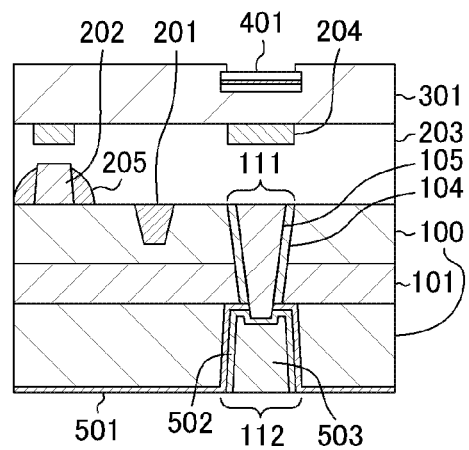
Figure 6C:
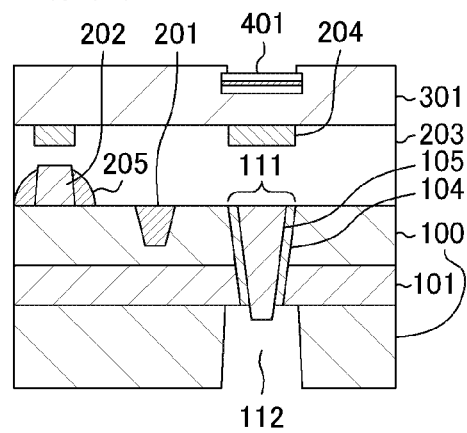

Then, as shown in FIG. 6C, the insulating film 104 exposed in the second hole 112 is removed by, e.g., CDE, wet etching, etc., to expose the lower portion of the first conductive film 105 in the second hole 112.

Next, as shown in FIG. 6D, the insulating film 501 being, e.g., a $SiO_2$ film, a SiN film, etc. is formed on the second surface of the semiconductor substrate 100 by, e.g., CVD to cover the sidewall surface and the bottom surface (i.e., the exposed surface of the first conductive film 105) of the second hole 112. Instead of the insulating film having the single layer structure, an insulating film having a stacked structure may be used as the insulating film 501. Then, a resist mask (not shown) for protecting the insulating film 501 on the second surface of the semiconductor substrate 100 is formed by photolithography, and a part of the insulating film 501, which covers the bottom surface of the second hole 112 is selectively etched and removed by, e.g., RIE to expose the first conductive film 105 in the second hole 112. Next, the base metal layer 502 for electroplating is formed to cover the second surface of the semiconductor substrate 100 as well as the sidewall surface and the bottom surface of the second hole 112. The base metal layer 502 is formed to be in contact with an exposed portion of the first conductive film 105 in the second hole 112.

After that, as shown in FIG. 6E, the second conductive film 503 is formed on the base metal layer 502 by electroplating to bury the second hole 112. As the material of the second conductive film 503 formed by electroplating, for example, copper is suitable in view of facilitation of plating and electric resistance. Then, the second conductive film 503 and the base metal layer 502 are partially removed by, e.g., CMP to back away until the insulating film 501 on the second surface of the semiconductor substrate 100 is exposed. This provides a through-via which is formed by electrically connecting the first conductive film 105 in the first hole 111 to the second conductive film 503 in the second hole 112. The first conductive film 105 is electrically connected to the second conductive film 503 via the base metal layer 502 at a position deeper than the insulating layer 101 buried in the semiconductor substrate 100.

Next, although not shown in the figure, the semiconductor substrate 100 is separated into electrical circuits by dicing, thereby forming semiconductor devices.

The above-described manufacturing method of the semiconductor device of this embodiment provides the following advantage in addition to advantages similar to those in the first embodiment. Specifically, the opening size of the second hole 112 at the connecting portion with the first hole 111 is set greater than the opening size of the first hole 111 at the connecting portion with the second hole 112. This prevents reduction in the area in which the first conductive film 105 is in contact with the second conductive film 503 with the base metal layer 502 interposed therebetween, even when the second hole 112 is misaligned with the first hole 111 during the formation. Also, the lower portion of the first conductive film 105 has a greater depth than the insulating layer 101 buried inside the semiconductor substrate 100. Thus, the first conductive film 105 is electrically connected to the second conductive film 503 also on a side surface of the lower portion of the first conductive film 105. That is, as compared to the case where the lower portion of the first conductive film 105 is located in the insulating layer 101, the area in which the first conductive film 105 is in contact with the second conductive film 503 with the base metal layer 502 interposed therebetween can be increased to reduce resistance of the through-via.

Note that, in this embodiment, the first hole 111 is formed before forming the isolation 201 and the gate electrode 202. However, instead, after the isolation 201 and the gate electrode 202 are formed and after the interlayer insulating film 203 covers the first surface (device formation surface) of the semiconductor substrate 100, the first hole 111 penetrating the interlayer insulating film 203 to reach the inside of the semiconductor substrate 100 may be formed, and then the insulating film 104 and the first conductive film 105 may be sequentially formed in the first hole 111.

A stacked semiconductor device formed by stacking multiple ones of the semiconductor device according to the first or second embodiment of the present disclosure will be described hereinafter with reference to the drawings, using the semiconductor device according to the second embodiment shown in FIG. 5 as an example.

Figure 7:
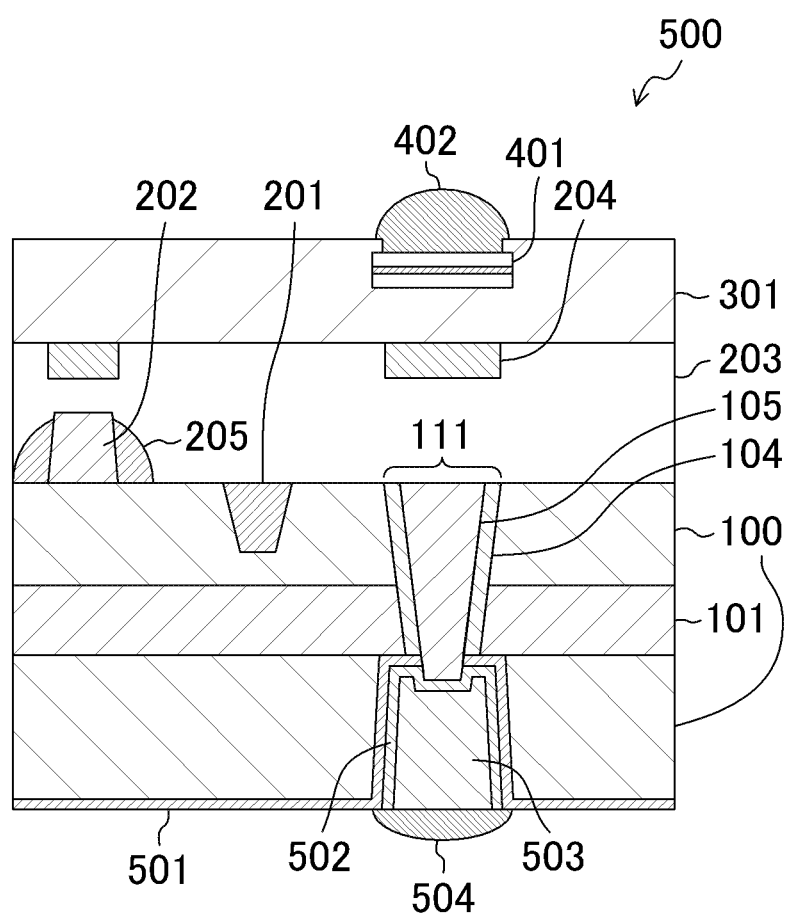
FIG. 7 is a cross-sectional view illustrating that an external connecting terminal is provided on the semiconductor device according to the second embodiment.
Figure 8:
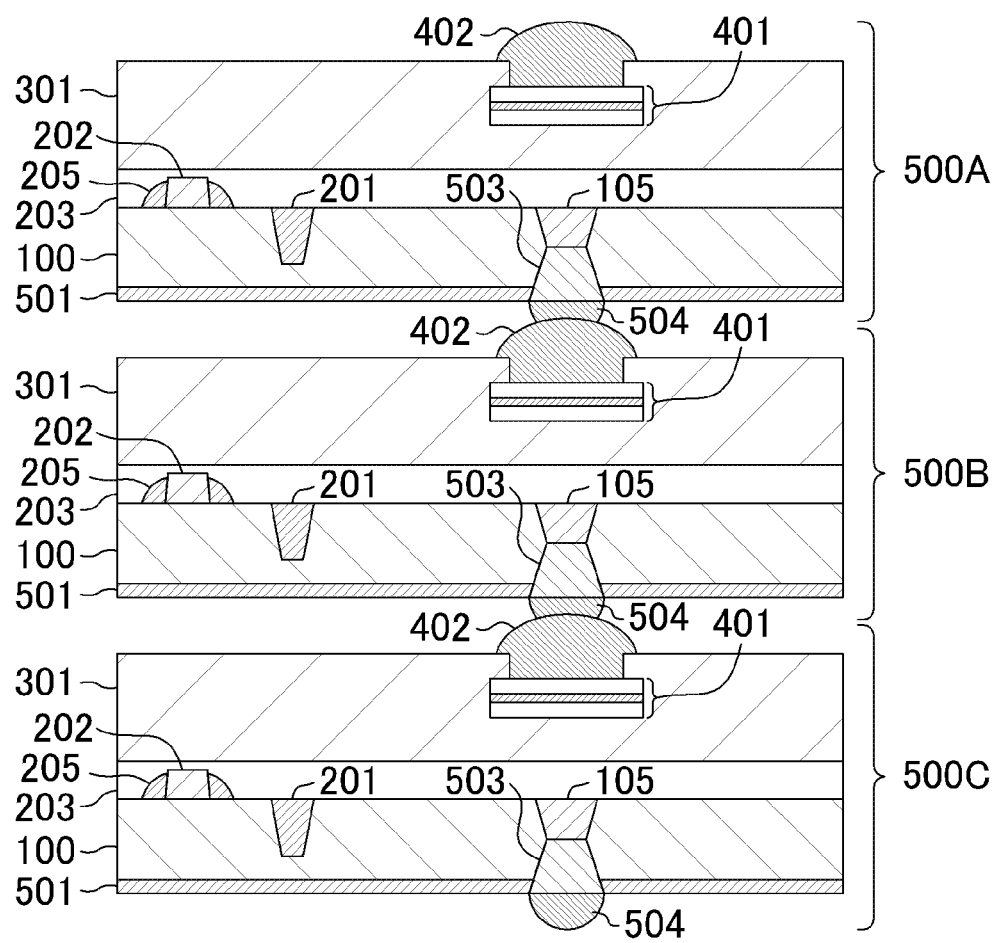
FIG. 8 is a cross-sectional view of a stacked semiconductor device formed by staking multiple ones of the semiconductor device according to the second embodiment.

FIG. 7 illustrates that, in the semiconductor device according to the second embodiment shown in FIG. 5, a connecting terminal 402 is provided on the electrode pad 401 at the first surface of the semiconductor substrate 100, and a connecting terminal 504 is provided on the exposed portion of the through-via (the second conductive film 503) at the second surface of the semiconductor substrate 100. In the semiconductor device 500 shown in FIG. 7, the connecting terminal 402 is exposed at the first surface, and the connecting terminal 504 is exposed at the second surface. Thus, as shown in, e.g., FIG. 8, multiple ones of the semiconductor device 500 (specifically, three semiconductor devices 500A, 500B, and 500C) are stacked one on another with the connecting terminals 402 and 504 interposed therebetween, thereby manufacturing a three-dimensional stacked semiconductor device which can be densely packaged. Note that, in FIG. 8, the elements of the semiconductor device 500 shown in FIG. 7 are partially omitted or modified for simplicity. In FIG. 8, the same reference characters as those of the semiconductor device 500 shown in FIG. 7 are used to represent equivalent elements, and repetitive explanation thereof will be omitted.

Third Embodiment

A stacked semiconductor device according to a third embodiment of the present disclosure, specifically, a stacked semiconductor device formed by three-dimensionally stacking a plurality of semiconductor devices including at least one of the semiconductor device according to the first or second embodiment of the present disclosure. Note that what is shown in the figures as well as forms, materials, sizes, etc. of various elements are merely examples and not limited to what is described in this embodiment. What is described in this embodiment may be modified as appropriate without departing from the spirit and scope of the present disclosure.

Figure 9A:
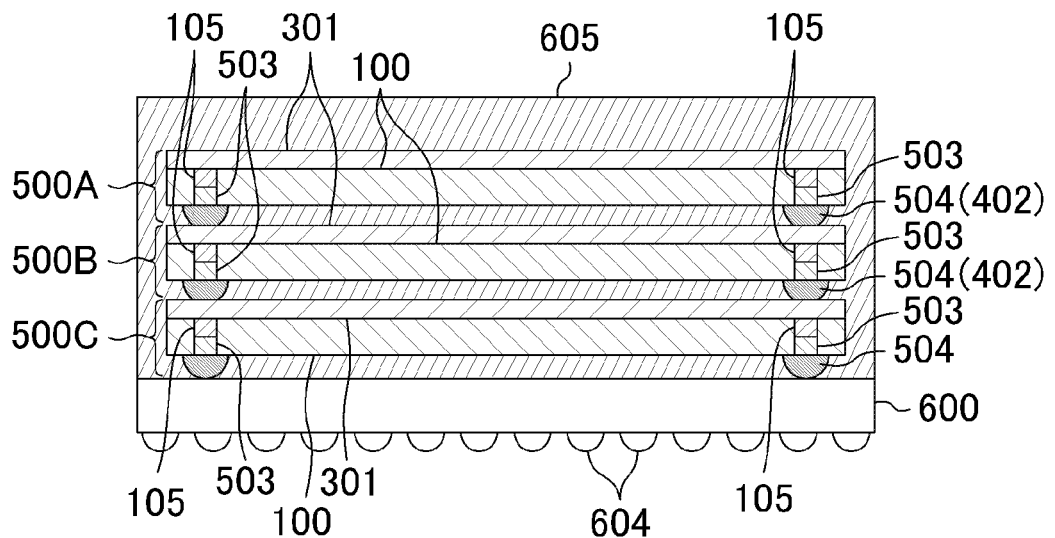
FIG. 9A is a cross-sectional view of a schematic structure of a stacked semiconductor device according to a third embodiment.

FIG. 9A is a cross-sectional view of a schematic structure of the stacked semiconductor device according to this embodiment. As shown in FIG. 9A, semiconductor devices 500A, 500B, and 500C having, e.g., the same structure as the semiconductor device 500 shown in FIG. 7 are sequentially stacked on a circuit substrate 600. The circuit substrate 600 is electrically connected to the semiconductor device 500A via the connecting terminal 504. The semiconductor device 500B is electrically connected to the semiconductor device 500A and 500C via connecting terminals 402 and 504. Note that, in FIG. 9A, the elements of the semiconductor device 500 shown in FIG. 7 are partially omitted or modified for simplicity. In FIG. 9A, the same reference characters as those of the semiconductor device 500 shown in FIG. 7 are used to represent equivalent elements, and repetitive explanation thereof will be omitted.

In this embodiment, the circuit substrate 600 is an organic substrate such as an epoxy substrate, and includes a desired circuit having an interconnect pattern made of, e.g., copper etc. The semiconductor devices 500A, 500B, and 500C are positioned to be stacked and mounted on the circuit substrate 600. The interconnect pattern formed in the circuit substrate 600 is electrically connected to the through-vias of the semiconductor devices 500A, 500B, and 500C. The semiconductor devices 500A, 500B, and 500C mounted on the circuit substrate 600 are sealed by a sealing resin 605. An electrode pad 604 electrically connected to the interconnect pattern formed in the circuit substrate 600 is provided at the back surface of the circuit substrate 600.

The above-described stacked semiconductor device of this embodiment achieves miniaturization and an increase in functions. Specifically, it was conventionally difficult to three-dimensionally stack a plurality of semiconductor devices on a same substrate. However, according to the stacked semiconductor device of this embodiment, for example, a system LSI, a solid-state image sensor, and a memory element can be formed on a same circuit substrate, thereby further increasing functions.

Note that, in the stacked semiconductor device of this embodiment, the semiconductor device 500A may include, e.g., a logic circuit, and the semiconductor device 500B may include, e.g., a solid-state image sensor.

While in the stacked semiconductor device of this embodiment, the three semiconductor devices 500A, 500B, and 500C are stacked, two, four, or more semiconductor devices may be stacked instead.

In the stacked semiconductor device of this embodiment, the semiconductor devices having the same structure as the semiconductor device 500 shown in FIG. 7, i.e., the semiconductor device according to the second embodiment are used as the semiconductor devices 500A, 500B, and 500C. Instead, a semiconductor device having the same structure as the semiconductor device according to the first embodiment may be used. Furthermore, not all the stacked semiconductor devices need to be the semiconductor devices according to the first or second embodiment, and at least one of the stacked semiconductor devices may be the semiconductor device according to the first or second embodiment.

A stacked semiconductor device according to a variation of this embodiment will be described hereinafter with reference to the drawings.

Figure 9B:
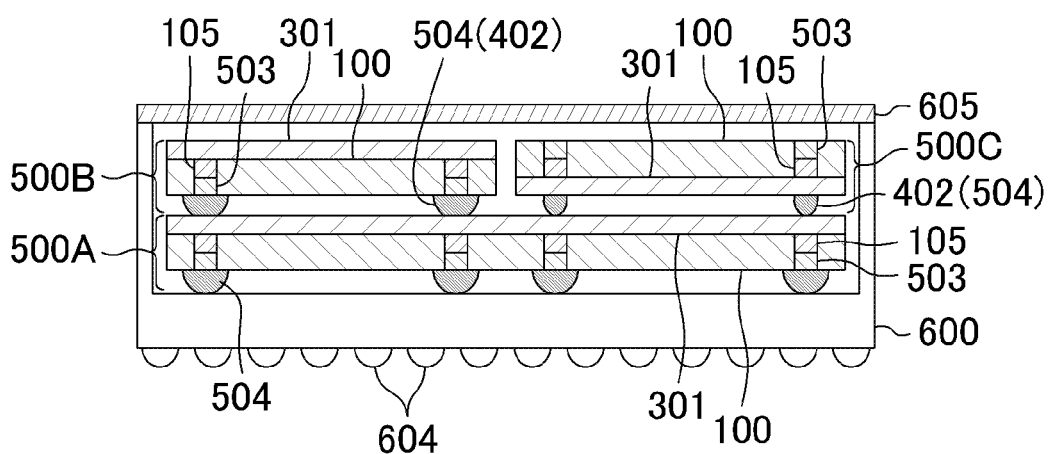
FIG. 9B is a cross-sectional view of a schematic structure of a stacked semiconductor device according to a variation of the third embodiment.

FIG. 9B is a cross-sectional view of a schematic structure of the stacked semiconductor device according to the variation of this embodiment. As shown in FIG. 9B, a semiconductor device 500A having the same structure as the semiconductor device 500 shown in FIG. 7 is formed on a circuit substrate 600. A semiconductor device 500B having, e.g., the same structure as the semiconductor device 500 shown in FIG. 7 is located on a first region of the semiconductor device 500A. A semiconductor device 500C having, e.g., the same structure as the semiconductor device 500 shown in FIG. 7 is located on a second region of the semiconductor device 500A. That is, the semiconductor devices 500B and 500C are located on a same plane. Tops of the semiconductor devices 500B and 500C are positioned at a substantially same height. Note that the semiconductor device 500C is located on the semiconductor device 500A in the upside down position with respect to the semiconductor device 500 shown in FIG. 7. The circuit substrate 600 is electrically connected to the semiconductor device 500A via the connecting terminal 504. The semiconductor device 500A is electrically connected to the semiconductor devices 500B and 500C via the connecting terminals 402 and 504. Note that, in FIG. 9B, the elements of the semiconductor device 500 shown in FIG. 7 are partially omitted or modified for simplicity. In FIG. 9B, the same reference characters as those of the semiconductor device 500 shown in FIG. 7 are used to represent equivalent elements, and repetitive explanation thereof will be omitted.

In this variation, the circuit substrate 600 is an organic substrate such as an epoxy substrate, and includes a desired circuit having an interconnect pattern made of, e.g., copper etc. The semiconductor devices 500A, 500B, and 500C are positioned to be stacked and mounted on the circuit substrate 600. The interconnect pattern formed in the circuit substrate 600 is electrically connected to the through-vias of the semiconductor devices 500A, 500B, and 500C. In this variation, the circuit substrate 600 includes a portion covering the stacked structure of the semiconductor devices 500A, 500B, and 500C from the side. A resin layer 605 is provided to cover the stacked structure from above. An electrode pad 604 electrically connected to the interconnect pattern formed in the circuit substrate 600 is provided at the back surface of the circuit substrate 600.

The above-described stacked semiconductor device of this variation achieves miniaturization and an increase in functions. Specifically, it was conventionally difficult to three-dimensionally stack a plurality of semiconductor devices on a same substrate. However, according to the stacked semiconductor device of this embodiment, for example, a system LSI, a solid-state image sensor, and a memory element can be formed on a same circuit substrate, thereby further increasing functions.

Note that, in the stacked semiconductor device of this variation, the semiconductor devices 500A, 500B, and 500C may have different functions. Specifically, the semiconductor device 500A may include a logic circuit, the semiconductor device 500B may include a memory element, and the semiconductor device 500C may include a solid-state image sensor.

While in the stacked semiconductor device of this variation, the three semiconductor devices 500A, 500B, and 500C are stacked, two, four, or more semiconductor devices may be stacked instead.

In the stacked semiconductor device of this variation, the semiconductor devices having the same structure as the semiconductor device 500 shown in FIG. 7, i.e., the semiconductor device according to the second embodiment are used as the semiconductor devices 500A, 500B, and 500C. Instead, a semiconductor device having the same structure as the semiconductor device according to the first embodiment may be used. Furthermore, not all the stacked semiconductor devices need to be the semiconductor devices according to the first or second embodiment, and at least one of the stacked semiconductor devices may be the semiconductor device according to the first or second embodiment.

In the stacked semiconductor device of this variation, the up and down directions of the semiconductor devices are not particularly limited when stacking the semiconductor devices. As shown by how to stack the semiconductor device 500A and the semiconductor device 500C, for example, the semiconductor devices can be stacked one on another so that first surfaces (front surfaces) of the semiconductor devices face each other.

In the first embodiment or the second embodiment, the opening size of the second hole at the second surface of the semiconductor substrate is preferably greater than the opening size of the first hole at the first surface of the semiconductor substrate. Specifically, as shown in FIG. 5, an opening size D2 of the second hole 112 at the second surface of the semiconductor substrate 100 is greater than an opening size D1 of the first hole 111 at the first surface of the semiconductor substrate 100. This structure provides the advantage of improving heat discharge in the stacked semiconductor device described in the third embodiment etc.

The advantage of improving the heat discharge will be described in detail with reference to FIG. 8. For example, in the semiconductor device 500A of the stacked semiconductor device shown in FIG. 8, when the opening size of the second hole at the second surface is greater than the opening size of the first hole at the first surface, the ratio of the area of the connecting terminal 504, which connects the semiconductor device 500A to the semiconductor device 500B, to the total area of the substrate can be increased. Even when the connecting terminal 504 is formed small, the ratio of exposure of the second conductive film 503 buried in the second hole increases on the connecting surface of the semiconductor device 500A to the semiconductor device 500B. That is, the area ratio of a conductive portion on the connecting surface of the semiconductor devices can be increased. Thus, heat generated in the stacked semiconductor device can be easily released from the connecting surface, thereby improving heat discharge.

When the opening size of the second hole at the second surface of the semiconductor substrate is greater than the opening size of the first hole at the first surface of the semiconductor substrate, the distance from the first surface of the semiconductor substrate to the insulating layer buried inside the semiconductor substrate is preferably shorter than the distance from the second surface of the semiconductor substrate to the insulating layer. For example, as shown in FIG. 5, the distance from the first surface of the semiconductor substrate 100 to the insulating layer 101 is preferably shorter than the distance from the second surface of the semiconductor substrate 100 to the insulating layer 101.

In order to effectively improve heat discharge, in the finest semiconductor device of a plurality of semiconductor devices forming a stacked semiconductor device, the opening size of the second hole at the second surface is preferably greater than the opening size of the first hole at the first surface. For example, in a semiconductor device with highly dense semiconductor elements such as a semiconductor device including a logic circuit, the structure in which the opening size of the second hole at the second surface is greater is preferably employed. On the other hand, in a semiconductor device with less dense semiconductor elements such as a semiconductor device including a memory element, the structure in which the opening size of the second hole at the second surface is greater may not be employed. In other words, the structure in which the opening size of the second hole at the second surface is smaller may be employed.

What is claimed is:
1. A semiconductor device comprising:
a semiconductor substrate including a first surface, which has an active element thereon, and a second surface opposite to the first surface;
a through-via penetrating the semiconductor substrate; and
an interlayer insulating film disposed on the first surface and the active element,
wherein the through-via has a stacked structure of a first conductive film formed in a portion of the semiconductor substrate closer to the first surface, and a second conductive film formed in a portion of the semiconductor substrate closer to the second surface, the through-via has a minimum diameter between the first and second surfaces of the semiconductor substrate, an insulating layer is buried inside the semiconductor substrate, and the first conductive film is electrically connected to the second conductive film in the insulating layer.

2. The semiconductor device of claim 1, wherein the first conductive film is buried in a first hole formed in a portion of the semiconductor substrate closer to the first surface, the second conductive film is buried in a second hole formed in a portion of the semiconductor substrate closer to the second surface, and the first hole is connected to the second hole, and the first conductive film is electrically connected to the second conductive film, thereby forming the through-via.

3. The semiconductor device of claim 2, wherein an opening size of the second hole at a connecting portion with the first hole is greater than an opening size of the first hole at a connecting portion with the second hole.

4. The semiconductor device of claim 3, wherein the first hole has a greater depth than the second hole.

5. The semiconductor device of claim 2, wherein an opening size of the second hole at the second surface is greater than an opening size of the first hole at the first surface.

6. The semiconductor device of claim 1, wherein the insulating layer is discontinuously formed along a principal surface of the semiconductor substrate.

7. The semiconductor device of claim 1, wherein a first insulating via coating film is formed between the first conductive film and the semiconductor substrate, and a second insulating via coating film is formed between the second conductive film and the semiconductor substrate.

8. A stacked semiconductor device formed by stacking a first semiconductor device including a logic circuit and a second semiconductor device including a solid-state image sensor, wherein at least one of the first semiconductor device or the second semiconductor device is the semiconductor device of claim 1.

9. The stacked semiconductor device of claim 8, wherein the second semiconductor device is stacked on the first semiconductor device.

10. A stacked semiconductor device formed by stacking a first semiconductor device, a second semiconductor device, and a third semiconductor device, wherein the second semiconductor device is stacked on a first region of the first semiconductor device, the third semiconductor device is stacked on a second region of the first semiconductor device, and at least one of the first semiconductor device, the second semiconductor device, or the third semiconductor device is the semiconductor device of claim 1.

11. The stacked semiconductor device of claim 10, wherein the first semiconductor device, the second semiconductor device, and the third semiconductor device have different functions.

12. The stacked semiconductor device of claim 10, wherein a top of the second semiconductor device is located at a substantially same height as a top of the third semiconductor device.

13. The stacked semiconductor device of claim 10, wherein the first semiconductor device includes a logic circuit.

14. The stacked semiconductor device of claim 10, wherein the second semiconductor device includes a memory element.

15. The stacked semiconductor device of claim 10, wherein the third semiconductor device includes a solid-state image sensor.

16. A manufacturing method of a semiconductor device comprising the steps of:

forming a first hole in a semiconductor substrate from a first surface of the semiconductor substrate including the first surface and a second surface opposite to the first surface;

forming a first conductive film in the first hole;

forming an active element on the first surface, after forming the first conductive film;

forming an interlayer insulating film on the first surface and the active element;

forming a second hole connected to the first hole in the semiconductor substrate from the second surface of the semiconductor substrate, after forming the interlayer insulating film; and forming in the second hole, a second conductive film to be electrically connected to the first conductive film, thereby forming a through-via, wherein an insulating layer is buried inside the semiconductor substrate, and the first conductive film is electrically connected to the second conductive film in the insulating layer.

17. The method of claim 16, wherein the insulating layer is formed by SIMOX.

18. The method of claim 16, wherein the insulating layer is discontinuously formed along a principal surface of the semiconductor substrate.

19. The method of claim 16, wherein in the step of forming a second hole, the semiconductor substrate is etched from the second surface using the insulating layer as an etching stopper to form the second hole.

20. The method of claim 16, wherein an opening size of the second hole at a connecting portion with the first hole is greater than an opening size of the first hole at a connecting portion with the second hole.

21. The method of claim 16, wherein an opening size of the second hole at the second surface is greater than an opening size of the first hole at the first surface.

* * * * *